United States Patent [19]

Shirland

[11] 4,120,705
[45] Oct. 17, 1978

[54] VACUUM DEPOSITION PROCESS FOR FABRICATING A CDS—CU$_2$S HETEROJUNCTION SOLAR CELL DEVICE

[75] Inventor: Fred A. Shirland, Franklin Township, Westmorland County, Pa.

[73] Assignee: Westinghouse Electric Corp., Pittsburgh, Pa.

[21] Appl. No.: 657,136

[22] Filed: Feb. 11, 1976

Related U.S. Application Data

[63] Continuation-in-part of Ser. No. 563,420, Mar. 28, 1975, abandoned.

[51] Int. Cl.$^2$ .................. H01L 21/363; H01L 31/04
[52] U.S. Cl. ........................... 148/174; 29/572; 136/89 CD; 148/1.5; 148/175; 357/30; 357/62; 427/70; 427/74
[58] Field of Search .............. 148/1.5, 174, 175; 29/572; 136/89; 357/30, 62; 427/69, 70, 74

[56] References Cited

U.S. PATENT DOCUMENTS

| | | | |
|---|---|---|---|
| 2,820,841 | 1/1958 | Carlson et al. | 136/89 |
| 3,146,138 | 8/1964 | Shirland | 148/174 X |
| 3,290,175 | 12/1966 | Cusano et al. | 136/89 |
| 3,376,163 | 4/1968 | Abrahamsohn | 136/89 |
| 3,472,690 | 10/1969 | Hill | 136/89 X |
| 3,483,038 | 12/1969 | Hui et al. | 136/89 |
| 3,531,335 | 9/1970 | Heyerdahl et al. | 148/174 |
| 3,888,697 | 6/1975 | Bogus et al. | 136/89 |
| 3,902,920 | 9/1975 | Jordan et al. | 136/89 |
| 3,915,765 | 10/1975 | Cho et al. | 148/175 |
| 3,975,211 | 8/1976 | Shirland | 136/89 |
| 3,990,914 | 11/1976 | Weinstein et al. | 136/89 |

OTHER PUBLICATIONS

Chang et al., "Fabrication For Multilayer Semiconductor Devices" I.B. M. Tech. Discl. Bull., vol. 15, No. 2, Jul. 1972, pp. 365-366.

Moss, H.I., "Large-Area Thin-Film Photovoltaic Cells" R.C.A. Review, Mar. 1961, pp. 29-37.

Beecham, D., "Cadmium/Sulfur Isothermal Source For CdS Deposition", Review of Scientific Instruments, vol. 41, No. 11, Nov. 1970, pp. 1654-1657.

Hass et al., Editors, "Physics of Thin Films", Textbook, vol. 5, Academic Press, N.Y. 1969, pp. 163-177, 228-235.

Primary Examiner—L. Dewayne Rutledge
Assistant Examiner—W. G. Saba
Attorney, Agent, or Firm—C. L. Menzemer

[57] ABSTRACT

A solar cell is comprised of (1) a Cu$_2$S thin film evaporated on a conductive substrate at an elevated temperature thereby growing a polycrystalline film of preferred orientation, and (2) an outer CdS layer grown epitaxially on the Cu$_2$S film.

2 Claims, 2 Drawing Figures

VACUUM DEPOSITION PROCESS FOR FABRICATING A CDS—CU₂S HETEROJUNCTION SOLAR CELL DEVICE

CROSS-REFERENCE TO RELATED APPLICATION

The present application is a continuation-in-part of application Ser. No. 563,420, filed on Mar. 28, 1975, now abandoned.

The present application is related to application Ser. No. 563,421, filed on Mar. 28, 1975, now U.S. Pat. No. 3,975,211.

BACKGROUND OF THE INVENTION

1. Field of the Invention

The present invention pertains to heterojunction devices and particularly to CdS - $Cu_2S$ thin film solar cells.

2. Description of the Prior Art

Some effort has been made in the past to produce a backwall CdS — $Cu_2S$ thin film solar cell employing a transparent substrate anticipating advantages over conventional frontwall CdS — $Cu_2S$ solar cells. For the purposes of this specification, the term "frontwall" refers to devices illuminated through the $Cu_2S$ layer to the junction while "backwall" refers to devices illuminated through the CdS layer to the junction. In a frontwall arrangement, which is the present standard type of cell construction, a layer of CdS is deposited on a metallic substrate and then a layer of $Cu_2S$ is formed on the CdS. A metallic grid is then applied to the surface of the $Cu_2S$, and finally transparent protective coating is applied. In a particular configuration of a backwall CdS — $Cu_2S$ thin film solar cell, the $Cu_2S$ is adjacent to the substrate and the CdS is then deposited on the $Cu_2S$. In this backwall structure a grid is also attached, but in this case it is attached to the thicker, more conductive CdS layer which permits a coarser, less expensive grid to be used. Furthermore, in the backwall structure a protective coating is not needed since the $Cu_2S$ layer is not vulnerable to the atmosphere as a result of it being sandwiched between the substrate and the stable CdS layer.

Unfortunately, these and other hoped for advantages of the backwall structure described above have not been fully realized since past attempts to produce such a backwall structure failed to reproduce the essential epitaxially formed $Cu_2S$ — CdS heterojunction. The present invention solves this problem, and provides a method for producing an epitaxial heterojunction device.

SUMMARY OF THE INVENTION

A heterojunction device is produced by vacuum depositing a first crystallized compound on a substrate, then abruptly shifting to vacuum deposition of a second crystalline compound epitaxially on said first crystalline compound.

DESCRIPTION OF THE PREFERRED EMBODIMENT

The present invention discloses an epitaxial heterojunction device which has advantageous application as a solar cell.

Figure 1:
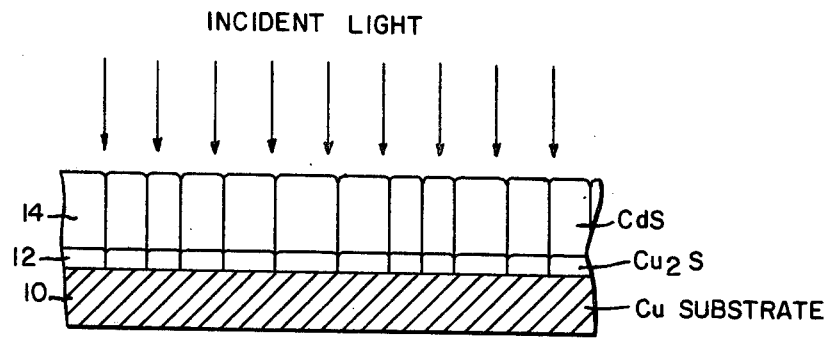
FIG. 1 is a cross-sectional view of a portion of a first embodiment of the present invention.

In a first preferred embodiment illustrated in FIG. 1, a $Cu_2S$ layer 12 is disposed upon a metallic substrate 10 and a CdS layer 14 is disposed upon the $Cu_2S$ layer 12. In accordance with the inventive method, $Cu_2S$ starting material is held close to the stoichiometric ratio of two copper atoms to one sulfur atom and is vacuum evaporated onto the metallic substrate 10 held in the temperature range of 200° C to 435° C, thereby producing a polycrystalline film deposit 12 of $Cu_2S$ in the hexagonal crystalline form. The hexagonal $Cu_2S$ crystals assume a preferred orientation on the substrate 10, whereby the "C"-axis of each crystal is generally perpendicular to the substrate 10, and the three "A" axes of each crystal are randomly oriented in directions generally parallel to the plane of the substrate 10.

When a sufficient thickness of $Cu_2S$ is achieved, the $Cu_2S$ evaporation is abruptly halted and the CdS evaporation abruptly started while being at the elevated temperature. For example, a fast action shutter arrangement in a vacuum chamber is preferably used so that CdS crystallites 14 grow epitaxially on those of the previously deposited layer 12 of $Cu_2S$. The resulting CdS layer 14 is made many times as thick as the $Cu_2S$ layer 12 so that when the whole structure is cooled to room temperature the normally hexagonal crystalline form of CdS will dominate and hold the $Cu_2S$ in the same structural form. A preferred thickness for $Cu_2S$ layer 12 is from about 0.1 micron to about 1.0 micron, while a preferred thickness for CdS layer 14 is from about 1.0 micron to about 10.0 microns.

In this manner a clean abrupt epitaxial heterojunction is produced between the $Cu_2S$ layer 12 and the CdS layer 14 providing an efficient device for solar energy conversion. It will be apparent to those skilled in the art that the present invention provides the first all vacuum deposited epitaxial CdS — $Cu_2S$ thin film solar cell.

Furthermore, such a structure has several marked advantages over the conventional frontwall CdS — $Cu_2S$ thin film solar cell:

First, a very fine mesh grid contact is no longer necessary; the thinner $Cu_2S$ layer 12 is now backed up by a continuous metallic contact 10. Any grid (not shown) on the CdS side of the junction can be much coarser, and thus much lower in cost, because the CdS layer 14 is thicker and more conductive than the $Cu_2S$ layer 12.

Second, a separate passivation layer is no longer needed to protect the $Cu_2S$ layer 12 from the atmosphere. The metallic substrate 10 can readily be made impermeable to air and water vapor, and several microns or more of the CdS film 14 on the other side of the $Cu_2S$ layer 12 will be equally impermeable. Thus only the edges of the cell need to be protected.

Third, the $Cu_2S$ layer 12 can now be made somewhat thicker to absorb more of the incident light in a planar film without sacrificing collection efficiency, since the light is entering from the junction side rather than from the side opposite the junction, as indicated by the direction of the arrows in FIG. 1. Also, with the CdS film 14 only a few microns thick, higher output is obtained since more of the shorter wavelength photons that are absorbed in the CdS will be absorbed closer to the junction than would normally be the case for a prior art backwall cell.

Fourth, with this process, several steps in the normal cell processing are eliminated and the key steps are completed in the same vacuum chamber with the same pump-down, thus providing maximum production efficiency.

Figure 2:
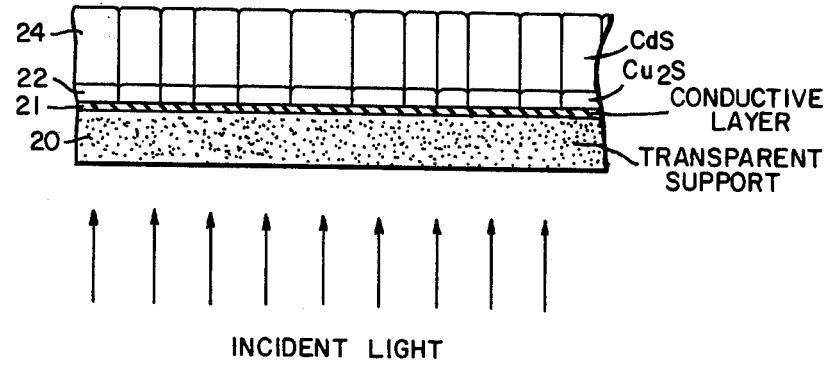
FIG. 2 is a cross-sectional view of a portion of a second embodiment of the present invention.

The inventive method may also be employed to produce a novel frontwall CdS — $Cu_2S$ solar cell as illustrated in FIG. 2. In place of the copper substrate 10 of FIG. 1, the embodiment of FIG. 2 employs a transparent glass support member 20 which is coated with a thin conductive layer 21 in a known manner. For example, the member 20 is preferably coated with from about 40 to about 100 Å of $SnO_2$.

The method of producing layers 22 and 24 of FIG. 2 is the same as the method of producing layers 12 and 14 of FIG. 1. That is, the layer 22 is produced by vacuum deposition of $Cu_2S$ at a temperature of between 200° C and 435° C with the $Cu_2S$ starting material being held in the stoichiometric ratio of two copper atoms to one sulphur atom. When a thickness of about 0.1 to 1.0 micron of $Cu_2S$ is achieved, the $Cu_2S$ evaporation is abruptly halted and the CdS evaporation is abruptly started, preferably by means of fast shutters.

The resulting structure of FIG. 2 is capable of being operated either as a frontwall or as a backwall solar cell. With the incident light entering the device through the transparent support 20 as shown in FIG. 2, the device is being operated in the frontwall mode.

It will be apparent to those skilled in the art that the arrangement of FIG. 2 achieves an optimum combination of frontwall operation with many of the structural advantages of a backwall device. For example, an advantage of the embodiment of FIG. 2 over that of FIG. 1 is that photons having wavelengths shorter than 5200 Å are absorbed in the CdS layer 14 of FIG. 1 without reaching the junction, whereas such short wavelength photons entering through the $Cu_2S$ layer 22 of FIG. 2 are absorbed at or near the junction thereby achieving more efficient solar energy conversion.

It will be further apparent that the present invention provides a novel epitaxial heterojunction device, produced in a novel manner, which has advantageous application in the harvesting of solar energy.

What is claimed is:

1. A method for making an epitaxial heterojunction device comprising the steps of:
    (a) heating a substrate having an electrically conductive surface in a vacuum chamber to a temperature range of about 200° C to about 435° C;
    (b) vapor depositing a crystalline layer of $Cu_2S$ on said conductive surface from starting material maintaining close to a stoichiometric ratio of two copper atoms to one sulfur atom while maintaining said temperature range; and
    (c) halting step (b) and abruptly initiating vapor deposition of a crystalline layer of Cds on said crystalline layer of $Cu_2S$ while maintaining said temperature range.

2. A method for making an epitaxial heterojunction device as set forth in claim 1 wherein: the crystalline layer of $Cu_2S$ is between about 0.1 and 1.0 micron in thickness, and the crystalline layer of CdS is between about 1.0 and 10.0 microns in thickness.

* * * * *